United States Patent
Xie et al.

(10) Patent No.: US 11,626,560 B2
(45) Date of Patent: Apr. 11, 2023

(54) PIXEL STRUCTURE, DISPLAY SUBSTRATE, MASK AND EVAPORATION METHOD

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Yi Xie, Beijing (CN); Hsinju Ho, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 189 days.

(21) Appl. No.: 17/255,193

(22) PCT Filed: May 14, 2020

(86) PCT No.: PCT/CN2020/090165
§ 371 (c)(1),
(2) Date: Dec. 22, 2020

(87) PCT Pub. No.: WO2020/233487
PCT Pub. Date: Nov. 26, 2020

(65) Prior Publication Data
US 2021/0217958 A1    Jul. 15, 2021

(30) Foreign Application Priority Data
May 17, 2019  (CN) .......................... 201910414479.6

(51) Int. Cl.
*H01L 51/00* (2006.01)
*H01L 27/32* (2006.01)
(Continued)

(52) U.S. Cl.
CPC ........ *H01L 51/0011* (2013.01); *C23C 14/042* (2013.01); *H01L 27/3218* (2013.01);
(Continued)

(58) Field of Classification Search
CPC ......................................... H01L 27/3211–3218
See application file for complete search history.

(56) References Cited

U.S. PATENT DOCUMENTS 8,313,806 B2 * 11/2012 Matsuura .............. C23C 14/042
427/256
10,644,077 B1 * 5/2020 Choi .................... G09G 3/3233
(Continued)

FOREIGN PATENT DOCUMENTS

| CN | 104201192 A | 12/2014 |
| CN | 105154823 A | 12/2015 |

(Continued)

OTHER PUBLICATIONS

Machine translation, Liu, Chinese Pat. Pub. No. CN-110335892-A, translation date: Aug. 22, 2022, Clarivate Analytics, all pages. (Year: 2022).*

(Continued)

*Primary Examiner* — Victoria K. Hall
(74) *Attorney, Agent, or Firm* — Dority & Manning, P.A.

(57) ABSTRACT

A pixel structure includes a plurality of first sub-pixels arranged in a first direction and a second direction. A maximum dimension of at least one first sub-pixel in a first direction is less than a first set value, and a maximum dimension of the at least one first sub-pixel in a second direction is greater than a second set value. The first set value is a maximum dimension of a set sub-pixel in the first direction, and the second set value is a maximum dimension of the set sub-pixel in the second direction. The first sub-pixel has an area equal to an area of the set sub-pixel.

18 Claims, 8 Drawing Sheets

(51) Int. Cl.
  *H01L 51/56* (2006.01)
  *C23C 14/04* (2006.01)
(52) U.S. Cl.
  CPC .......... *H01L 27/3246* (2013.01); *H01L 51/56*
  (2013.01); *H01L 27/3216* (2013.01)

(56) References Cited

U.S. PATENT DOCUMENTS

| | | | | |
|---|---|---|---|---|
| 10,832,616 B2* | 11/2020 | Lee | ...................... | H01L 27/3216 |
| 10,923,543 B1* | 2/2021 | Chen | ...................... | H01L 51/56 |
| 2009/0017192 A1* | 1/2009 | Matsuura | .............. | C23C 14/042 |
| | | | | 118/721 |
| 2012/0024232 A1* | 2/2012 | Lee | ...................... | C23C 14/243 |
| | | | | 118/726 |
| 2012/0049726 A1* | 3/2012 | Yoo | ...................... | H01L 27/3213 |
| | | | | 313/504 |
| 2013/0234917 A1* | 9/2013 | Lee | ...................... | H01L 27/3216 |
| | | | | 345/82 |
| 2013/0277645 A1* | 10/2013 | Antonenkov | ....... | H01L 51/0011 |
| | | | | 438/34 |
| 2014/0353598 A1* | 12/2014 | Jeong | ...................... | H01L 51/56 |
| | | | | 257/40 |
| 2015/0009104 A1* | 1/2015 | Kim | ...................... | G09G 3/3225 |
| | | | | 345/76 |
| 2015/0021637 A1* | 1/2015 | Ahn | ...................... | H01L 27/3218 |
| | | | | 257/89 |
| 2015/0022078 A1* | 1/2015 | Huang | ................ | H01L 27/3218 |
| | | | | 313/504 |
| 2015/0035731 A1* | 2/2015 | Wang | ................ | H01L 27/3218 |
| | | | | 345/76 |
| 2015/0123150 A1* | 5/2015 | Adachi | ............... | H01L 27/3246 |
| | | | | 257/88 |
| 2015/0123952 A1* | 5/2015 | Kim | ...................... | H01L 51/5271 |
| | | | | 345/82 |
| 2016/0240594 A1* | 8/2016 | Zhu | ...................... | H01L 27/3216 |
| 2016/0240802 A1* | 8/2016 | Lee | ...................... | H01L 27/326 |
| 2016/0254327 A1* | 9/2016 | Bai | ...................... | H01L 27/3218 |
| | | | | 257/40 |
| 2016/0322433 A1* | 11/2016 | Kim | ...................... | H01L 27/3216 |
| 2016/0329385 A1* | 11/2016 | Qiu | ...................... | H01L 27/3218 |
| 2016/0343284 A1* | 11/2016 | Sun | ...................... | G09G 3/3225 |
| 2017/0104158 A1* | 4/2017 | Kawato | ............... | H01L 51/0011 |
| 2017/0244035 A1* | 8/2017 | Kawato | ............... | H01L 51/0011 |
| 2017/0268096 A1* | 9/2017 | Huang | ................ | C23C 14/542 |
| 2017/0278905 A1* | 9/2017 | Hsu | ...................... | H01L 27/3213 |
| 2017/0373132 A1* | 12/2017 | Choung | ............. | H01L 27/3218 |
| 2018/0158883 A1* | 6/2018 | Zhang | ................ | H01L 27/3218 |
| 2018/0182828 A1* | 6/2018 | Kim | ...................... | H01L 51/5012 |
| 2018/0247985 A1* | 8/2018 | Jeon | ................... | H01L 51/0097 |
| 2018/0261654 A1* | 9/2018 | Hwang | ............... | H01L 27/3218 |
| 2019/0218656 A1* | 7/2019 | Mu | ........................ | C23C 14/12 |
| 2019/0355794 A1* | 11/2019 | Dai | ........................ | C23C 14/24 |
| 2019/0363310 A1* | 11/2019 | Nakamura | ............. | G09F 9/302 |
| 2019/0386242 A1* | 12/2019 | Choi | ................... | H01L 51/5234 |
| 2020/0006443 A1* | 1/2020 | Park | ...................... | H01L 27/322 |
| 2020/0080186 A1 | 3/2020 | Liu et al. | | |
| 2020/0208252 A1 | 7/2020 | Wang et al. | | |
| 2020/0273924 A1* | 8/2020 | Xiao | ...................... | C23C 14/12 |
| 2020/0279892 A1 | 9/2020 | Chen et al. | | |
| 2020/0321406 A1* | 10/2020 | Lee | ...................... | H01L 27/323 |
| 2020/0365665 A1* | 11/2020 | Choi | ................... | H01L 27/3216 |
| 2021/0013274 A1* | 1/2021 | He | ........................ | H01L 27/326 |
| 2021/0257422 A1* | 8/2021 | Xu | ........................ | H01L 51/56 |

FOREIGN PATENT DOCUMENTS

| | | | | | |
|---|---|---|---|---|---|
| CN | 105679796 | A | | 6/2016 | |
| CN | 106298833 | A | | 1/2017 | |
| CN | 106795618 | A | * | 5/2017 | .......... H01L 51/0011 |
| CN | 107887404 | A | * | 4/2018 | ........ H01L 27/3218 |
| CN | 207966985 | U | | 10/2018 | |
| CN | 109023257 | A | | 12/2018 | |
| CN | 110098239 | A | | 8/2019 | |
| CN | 110335892 | A | * | 10/2019 | ......... H01L 27/3216 |
| JP | 2017197797 | A | | 11/2017 | |
| JP | 2018155835 | A | | 10/2018 | |
| WO | WO-2019026131 | A1 | * | 2/2019 | ......... H01L 27/3216 |

OTHER PUBLICATIONS

Machine translation, Zhang, Chinese Pat. Pub. No. CN-107887404-A, translation date: Aug. 23, 2022, Espacenet, all pages. (Year: 2022).*

Machine translation, Nakamura, WIPO Pat. Pub. No. WO-2019026131-A1, translation date: Aug. 22, 2022, Clarivate Analytics, all pages. (Year: 2022).*

Machine translation, Kawato, Chinese Pat. Pub. No. CN-106795618-A, translation, date: Aug. 22, 2022, Clarivate Analytics, all pages. (Year: 2022).*

International Searching Authority, Written Opinion of International Searching Authority, International application No. PCT/CN2020/090165, dated Aug. 26, 2020, all pages. (Year: 2020).*

International Searching Authority, International Search Report, International application No. PCT/CN2020/090165, dated Aug. 26, 2020, all pages. (Year: 2020).*

PCT International Search Report (w/ English translation) for corresponding PCT Application No. PCT/CN2020/090165 dated Aug. 25, 2020, 6 pages.

Chinese First Office Action (w/ English translation) for corresponding CN Application No. 201910414479.6, 13 pages.

Chinese Second Office Action (w/ English translation) for corresponding CN Application No. 201910414479.6, 2X3 pages.

* cited by examiner

| At least one evaporation source 2 is provided. Each evaporation source 2 includes an evaporation source body 21 and at least two restriction plates 22. The evaporation source body 21 has a plurality of evaporation nozzles 211, and the plurality of evaporation nozzles 211 are arranged at intervals in the longitudinal extension direction of the evaporation source 2. The at least two restriction plates 22 are disposed on two opposite sides of the evaporation source body 21 in a direction parallel to the longitudinal extension direction of the evaporation source 2 | S100 |
|---|---|
| The substrate to be evaporated is placed on the evaporation source 2. The substrate to be evaporated includes the base and the pixel defining layer disposed on a side of the base. The pixel defining layer has a plurality of first openings, and a row direction or a column direction in which the plurality of first openings are arranged is parallel to the longitudinal extension direction of the evaporation source 2 | S200 |
| The mask is placed between the at least one evaporation source 2 and the substrate to be evaporated | S300 |
| A plurality of first sub-pixels 61 are formed through evaporation in the plurality of first openings 91 by using the at least one evaporation source 2 | S400 |

FIG. 16

PIXEL STRUCTURE, DISPLAY SUBSTRATE, MASK AND EVAPORATION METHOD

CROSS-REFERENCE TO RELATED APPLICATIONS

The present application is a national phase entry under 35 USC 371 of International Patent Application No. PCT/CN2020/090165 filed on May 14, 2020, which claims priority to Chinese Patent Application No. 201910414479.6, filed on May 17, 2019, which are incorporated herein by reference in their entirety.

TECHNICAL FIELD

The present disclosure relates to the field of display technologies, and in particularly, to a pixel structure, a display substrate, a mask and an evaporation method.

BACKGROUND

Organic light-emitting diodes (abbreviated as OLEDs) have been widely used in the display field due to their advantages of high brightness, full viewing angle, fast response speed, flexible display, etc.

SUMMARY

In one aspect, a pixel structure is provided. The pixel structure includes a plurality of first sub-pixels arranged in a first direction and a second direction. A maximum dimension of at least one first sub-pixel in a first direction is less than a first set value, and a maximum dimension of the at least one first sub-pixel in a second direction is greater than a second set value. The first set value is a maximum dimension of a set sub-pixel in the first direction, and the second set value is a maximum dimension of the set sub-pixel in the second direction. The first sub-pixel has an area equal to an area of the set sub-pixel.

In some embodiments, the pixel structure further includes an evaporation shadow disposed around the first sub-pixel. A dimension of an evaporation shadow in the first direction is x, and a dimension of the evaporation shadow in the second direction is y, wherein x is greater than y. A difference between the maximum dimension of the first sub-pixel in the second direction and the second set value is a, wherein a is less than or equal to a product of 2 and a difference between x and y.

In some embodiments, in two adjacent first sub-pixels, an evaporation shadow of one first sub-pixel is non-overlapping with another first sub-pixel.

In some embodiments, the plurality of first sub-pixel are arranged at vertexes of a plurality of quadrilateral sub-regions, and a first sub-pixel is disposed at each vertex.

In some embodiments, a shape of the quadrilateral sub-region is a rectangle.

In some embodiments, a shape of the first sub-pixel is a rhombus. One diagonal line of the first sub-pixel is parallel to the first direction, and another diagonal line of the first sub-pixel is parallel to the second direction. A length of the diagonal line parallel to the second direction is greater than a length of the diagonal line parallel to the first direction.

In some embodiments, the first set value is equal to the second set value.

In some embodiments, the pixel structure further includes a plurality of second sub-pixels. A second sub-pixel is disposed at a center of each quadrilateral sub-region.

In some embodiments, the plurality of first sub-pixels include a plurality of red sub-pixels and a plurality of blue sub-pixels. The plurality of second sub-pixels include a plurality of green sub-pixels. In the first direction, the red sub-pixels and the blue sub-pixels are alternately arranged. In the second direction, the red sub-pixels and the blue sub-pixels are alternately arranged.

In some embodiments, in first sub-pixels and a second sub-pixel that are respectively disposed at vertexes and a center of each quadrilateral sub-region, a distance between each first sub-pixel and the second sub-pixel is equal.

In some embodiments, an evaporation shadow of each first sub-pixel is non-overlapping with an adjacent second sub-pixel.

In another aspect, a display substrate is provided. The display substrate includes a base and the pixel structure as described in some of the above embodiments. The pixel structure is disposed on a side of the base.

In some embodiments, the display panel further includes a pixel defining layer disposed on the side of the base. The pixel defining layer has a plurality of first openings. The plurality of first sub-pixels included in the pixel structure are respectively disposed in the plurality of first openings. A size of each first opening and a size of a first sub-pixel disposed in the first opening are the same.

In some embodiments, the plurality of first sub-pixel are arranged in an active area of the display substrate, the active area includes a plurality of quadrilateral sub-regions, and a first sub-pixel is disposed at a vertex of each quadrilateral sub-region.

In some embodiments, a shape of the first sub-pixel is a rhombus. One diagonal line of the first sub-pixel is parallel to the first direction, and another diagonal line of the first sub-pixel is parallel to the second direction. A length of the diagonal line parallel to the second direction is greater than a length of the diagonal line parallel to the first direction.

In some embodiments, the first set value is equal to the second set value.

In some embodiments, the display substrate further includes a plurality of second sub-pixels. A second sub-pixel is disposed at a center of each quadrilateral sub-region.

In yet another aspect, a mask is provided for forming the pixel structure described in some of the above embodiments. The mask includes a plurality of second openings. A maximum dimension of a second opening in the first direction is less than a third set value. The third set value is a maximum dimension of a set opening in the first direction.

In yet another aspect, an evaporation method is provided for forming the display substrate as described in some of the above embodiments. The evaporation method includes: providing at least one evaporation source, each evaporation source including an evaporation source body and at least two restriction plates, the evaporation source body having a plurality of evaporation nozzles arranged at intervals in a longitudinal extension direction of the evaporation source, and the at least two restriction plates being disposed on two opposite sides of the evaporation source body in a direction parallel to the longitudinal extension direction of the evaporation source; placing a substrate to be evaporated on the at least one evaporation source, the substrate to be evaporated including a base and a pixel defining layer disposed on a side of the base, the pixel defining layer having a plurality of first openings, and a row direction or a column direction in which the plurality of first openings are arranged being parallel to the longitudinal extension direction of the evaporation source; placing a mask between the at least one evaporation source and the substrate to be evaporated: and forming a plurality of first sub-pixels in the plurality of first openings by using the at least one evaporation source.

In some embodiments, the mask includes a plurality of second openings. A maximum dimension of a second opening in the first direction is less than a third set value, wherein the third set value is a maximum dimension of a set opening in the first direction.

BRIEF DESCRIPTION OF THE DRAWINGS

In order to describe technical solutions in embodiments of the present disclosure more clearly, accompanying drawings to be used in the description of the embodiments will be introduced below briefly. Obviously, the accompanying drawings to be described below are merely accompanying drawings of some embodiments of the present disclosure, and other accompanying drawings may be obtained according to these accompanying drawings by a person of ordinary skill in the art. In addition, the accompanying drawings to be described below may be regarded as schematic diagrams, and are not limitations on actual sizes of products, actual processes of methods and actual timings of signals to which the embodiments of the present disclosure relate.

DETAILED DESCRIPTION

Technical solutions in some embodiments of the present disclosure will be described below clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, terms such as "first" and "second" are for descriptive purposes only and are not to be construed as indicating or implying relative importance or implicitly indicating the number of indicated technical features. Thus, features defined as "first" and "second" may explicitly or implicitly include one or more of the features. In the description of the embodiments of the present disclosure, terms "a plurality of" and "the plurality of" each mean two or more unless otherwise specified.

As used herein, with reference to the context, the term "if" is, optionally, construed as "when" or "upon" or "in response to determining" or "in response to detecting". Similarly, with reference to the context, the phrase "if it is determined" or "if [a stated condition or event] is detected" is, optionally, construed as "When determining" or "in response to determining" or "when [the stated condition or event] is detected" or "in response to detecting [the stated condition or event],".

In addition, the use of "based on" is meant to be open and inclusive, as the process, steps, calculation, or other actions of being "based on" one or more of the said conditions or values may, in practice, be based on additional conditions or exceeding the said values.

As used herein, "about" or "approximately" is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional diagrams and/or plan diagrams as idealized exemplary drawings. In the drawings, thicknesses of layers and regions may be exaggerated for clarity. Therefore, variations in shapes with respect to the drawings due to, for example, manufacturing techniques and/or tolerances are conceivable. Therefore, the exemplary embodiments should not be construed as being limited to the shapes of the regions shown herein, but include shape deviations due to, for example, manufacturing. For example, an etched region shown as a rectangle generally has a curved feature. Therefore, the regions illustrated in the drawings are schematic in essence their shapes are not intended to illustrate the actual shapes of the regions in an apparatus and are not intended to limit the scope of the exemplary embodiments.

In the related art, in a process of manufacturing an organic light-emitting diodes (OLED) display device, an evaporation process is generally used to evaporate an evaporation material onto a substrate to form a plurality of sub-pixels in the OLED display device.

However, in the process of evaporation, due to an existence of an evaporation shadow, it is easy to cause evaporation materials evaporated in adjacent sub-pixel regions to be overlapped, which causes a color mixing problem in the adjacent sub-pixels, and affects a display effect of the OLED display device.

A process of forming the plurality of sub-pixels in the OLED display device through the evaporation process will be schematically described below.

Figure 1:
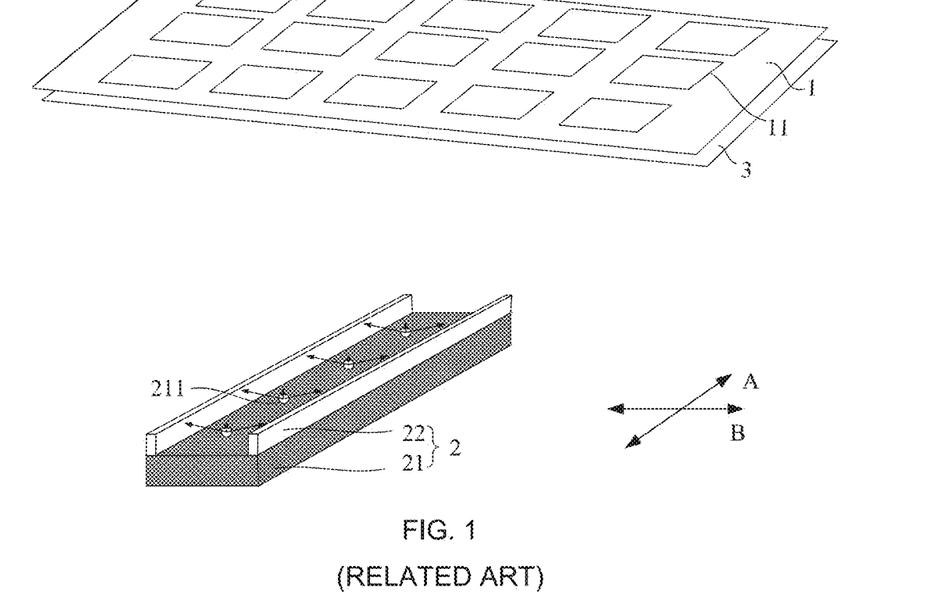
FIG. 1 is a schematic diagram of an evaporation process in accordance with the related art.

As shown in FIG. 1, when the OLED display device is manufactured, an object to be evaporated may be, for example, a motherboard 1 (the motherboard may include a plurality of substrate units 11). The motherboard 1 includes a substrate and a plurality of pixel defining layers disposed on a side of the substrate, and each substrate unit 11 includes a pixel defining layer. The pixel defining layer is provided with a plurality of openings therein, and the plurality of openings correspond to the plurality of sub-pixels in the OLED display device.

Figure 3:
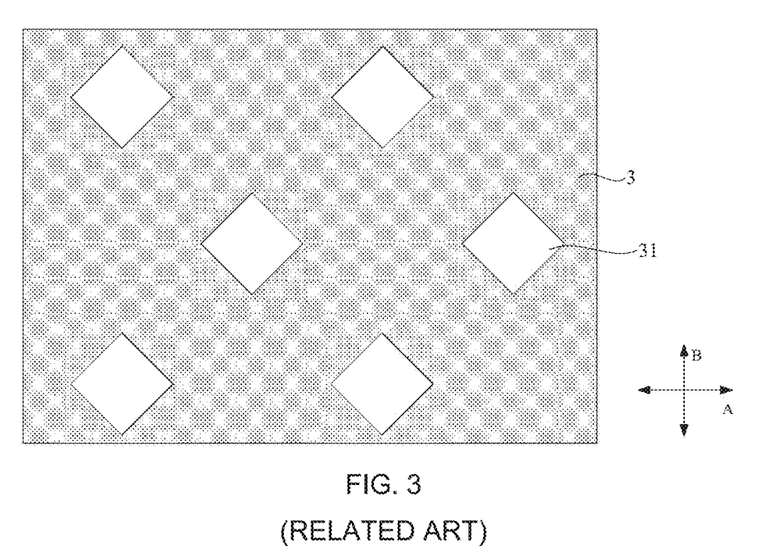
FIG. 3 is a diagram showing a structure of a mask in accordance with the related art.

Before evaporation, the motherboard 1 will be placed in an evaporation chamber, and a mask 3 will be provided between an evaporation source 2 (the evaporation source shown in FIG. 1 is, for example, a linear evaporation source) and the motherboard 1. As shown in FIG. 3, the mask 3 is provided with a plurality of via holes 31 therein, and the plurality of via holes 31 correspond to sub-pixels of a certain color (for example, red sub-pixels, green sub-pixels, or blue sub-pixels). In the process of evaporation, an evaporation material (for example, an organic material) exited from the evaporation source 2 may pass through the plurality of via holes 31 of the mask 3, and be deposited at a corresponding opening position of the pixel defining layer.

Figure 4:
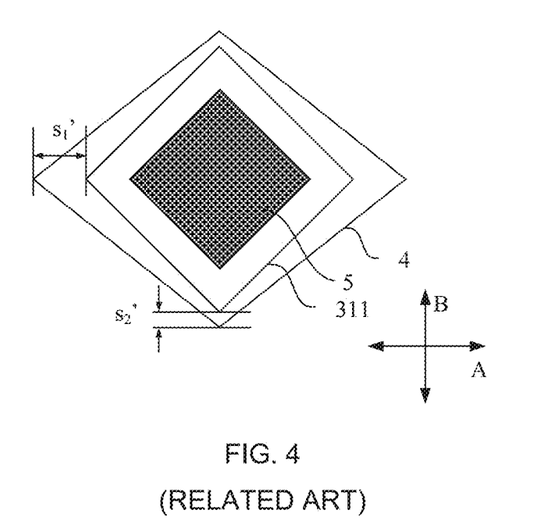
FIG. 4 is a schematic diagram of an evaporation shadow generated when a sub-pixel is evaporated in accordance with the related art.

In the process of evaporation, as shown in FIG. 4, due to a characteristic of the evaporation material traveling in a straight line, a range 4 of an evaporation region in which the evaporation material is actually deposited may be greater than a range of an evaporation region 311 (that is, an orthographic projection of a via hole 31 of the mask 3 on the substrate) defined by the via hole 31 of the mask 3, which causes a shadow effect of evaporation. In this way, when a sub-pixel 5 of a certain color is evaporated, the evaporation material is not only deposited at an opening position of a pixel defining layer corresponding to the sub-pixel 5 of the color, but also deposited at an opening position of a pixel defining layer corresponding to adjacent sub-pixels 5 of other colors, thereby causing a color mixing phenomenon.

Figure 2:
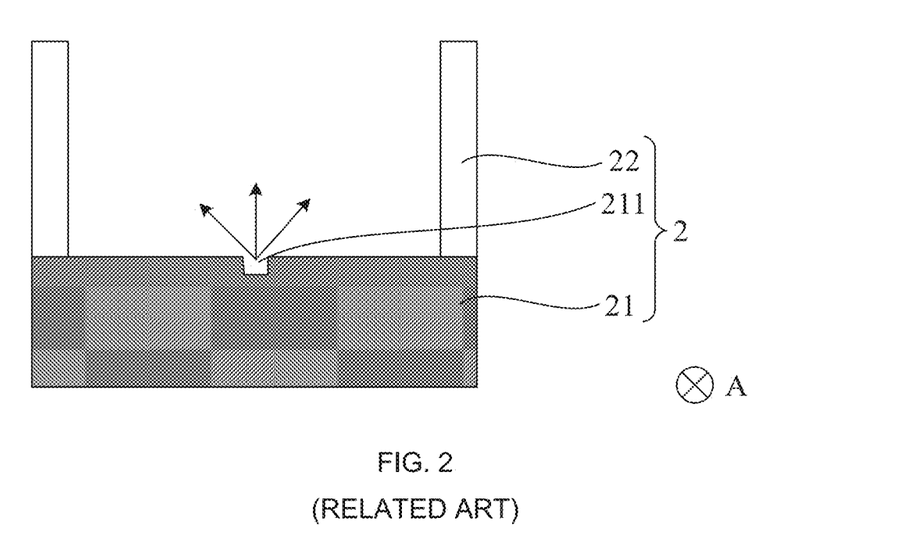
FIG. 2 is a front view of a linear evaporation source in accordance with the related art.
Figure 5:
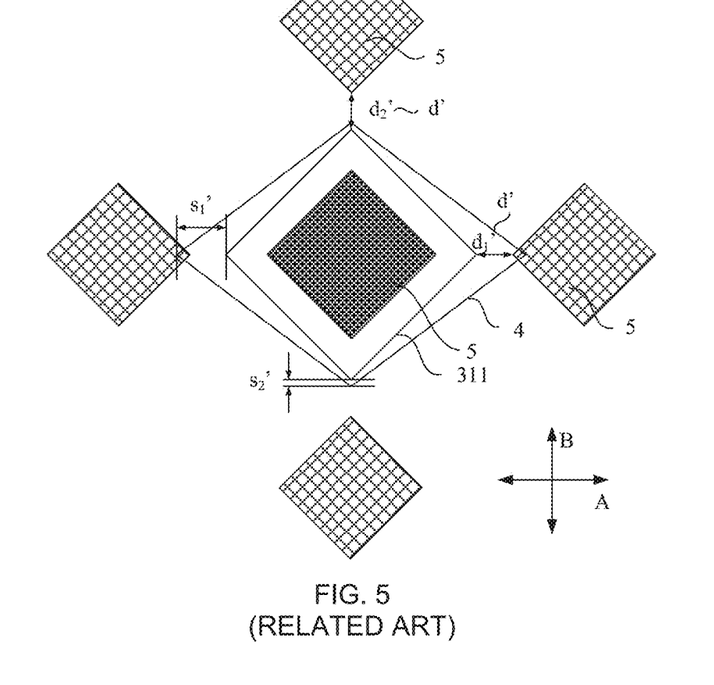
FIG. 5 is a schematic diagram when a sub-pixel is evaporated in accordance with the related art.

On this basis, as shown in FIGS. 1 and 2, for the evaporation source 2, taking a longitudinal extension direction of the evaporation source 2 as a first direction A, and a direction perpendicular to the longitudinal extension direction of the evaporation source 2 as a second direction B, in the process of evaporation, the evaporation source 2 may be moved in the second direction B. As shown in FIGS. 4 and 5, restriction plates 22 are provided on both sides of a plurality of evaporation nozzles 211 of an evaporation source body 21 of the evaporation source 2, an exit angle of the evaporation material in the second direction B may be controlled by adjusting the restriction plates 22, so that an evaporation shadow $s_2'$ generated by the evaporation material in the second direction B is small. As a result, the color mixing phenomenon between adjacent sub-pixels 5 in the second direction B may be avoided.

As shown in FIGS. 4 and 5, since it is difficult to change an exit angle of the evaporation material in the first direction A, an evaporation shadow $s1'$ in the first direction A is greater than an evaporation shadow $s_2'$ in the second direction B. In this way, the color mixing phenomenon may be prone to occur between adjacent sub-pixels 5 in the first direction A.

Figure 6:
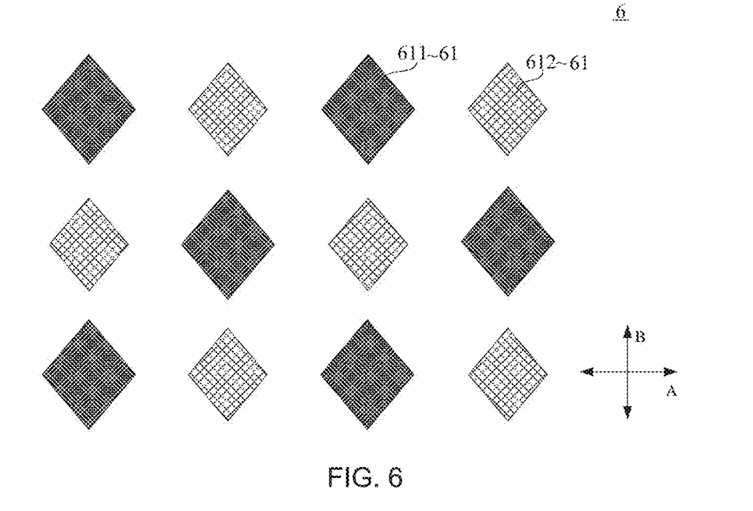
FIG. 6 is a diagram showing a structure of a pixel structure, in accordance with some embodiments of the present disclosure.
Figure 7:
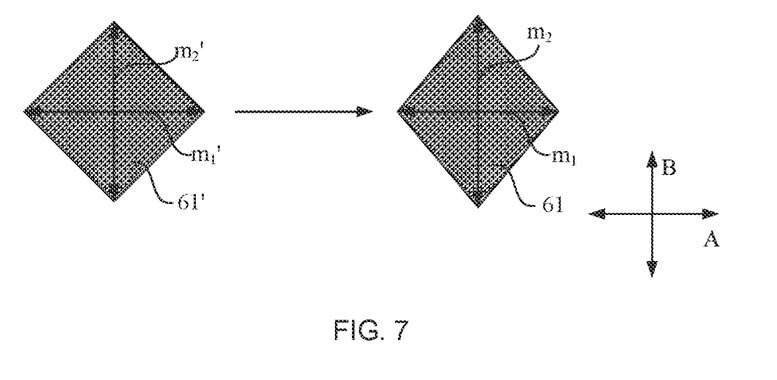
FIG. 7 is a comparison diagram of a first sub-pixel in a pixel structure and a set sub-pixel, in accordance with some embodiments of the present disclosure.

Therefore, some embodiments of the present disclosure provide a pixel structure 6. As shown in FIGS. 6 and 7, the pixel structure 6 includes a plurality of first sub-pixels 61. As shown in FIG. 7, a maximum dimension $m_1$ of at least one first sub-pixel 61 (such as each first sub-pixel 61) in the first direction A is less than a first set value, and a maximum dimension $m_2$ of the at least one first sub-pixel 61 in the second direction B is greater than a second set value. The first set value is a maximum dimension $m_1'$ of a set sub-pixel 61' in the first direction A, and the second set value is a maximum dimension $m_2'$ of the set sub-pixel 61' in the second direction B. An area of the first sub-pixel 61 is equal to an area of the set sub-pixel 61'.

Here, the first direction A and the second direction B may be determined according to an arrangement direction of the evaporation source 2.

For example, in a case where the longitudinal extension direction of the evaporation source 2 is the same as a row direction in which the plurality of first sub-pixels are arranged, the first direction A is the row direction in which the plurality of first sub-pixels are arranged, and the second direction B is a column direction in which the plurality of first sub-pixels are arranged.

For example, in a case where the longitudinal extension direction of the evaporation source 2 is the same as the column direction in which the plurality of first sub-pixels are arranged, the first direction A is the column direction in which the plurality of first sub-pixels are arranged, and the second direction B is the row direction in which the plurality of first sub-pixels are arranged.

The pixel structure 6 will be schematically described by taking an example in which the first direction A is the row direction in which the plurality of first sub-pixels are arranged, and the second direction B is the column direction in which the plurality of first sub-pixels are arranged.

In some examples, the plurality of first sub-pixels 61 include sub-pixels of at least one color.

For example, the plurality of first sub-pixels 61 include sub-pixels of one color. The sub-pixels of one color are, for example, red sub-pixels, blue sub-pixels or green sub-pixels.

For another example, the plurality of first sub-pixels 61 include sub-pixels of two different colors. The sub-pixels of two different colors are, for example, two of red sub-pixels, blue sub-pixels, and green sub-pixels.

For another example, the plurality of first sub-pixels 61 includes sub-pixels of three different colors. The sub-pixels of three different colors are, for example, blue sub-pixels, red sub-pixels, and green sub-pixels.

As shown in FIG. 6, the following description will be made by taking an example in which the plurality of first sub-pixels 61 include a plurality of red sub-pixels 611 and a plurality of blue sub-pixels 612.

In some examples, the set sub-pixel 61' is the sub-pixel 5 mentioned in the related art. The set sub-pixel 61' provides a reference for a dimension design of the first sub-pixel 61, and each first sub-pixel 61 has a corresponding set sub-pixel 61'.

In the pixel structure 6 provided by some embodiments of the present disclosure, the maximum dimension $m_1$ of the first sub-pixel 61 in the first direction A is set to be less than the first set value, and the maximum dimension $m_2$ of the first sub-pixel 61 in the second direction is set to be greater than the second set value. That is, on a basis of a size of the set sub-pixel 61', the maximum dimension $m_1'$ in the first direction A is reduced, and the maximum dimension $m_2'$ in the second direction is increased. In this way, a distance between the evaporation shadow $s_1$ generated in the first direction A and an adjacent first sub-pixel 61 may be increased while the color mixing phenomenon of the plurality of first sub-pixels 61 in the second direction B is avoided, so as to avoid color mixing phenomenon in the first direction A, thereby improving a display effect and a display quality of a display substrate and a display device to which the pixel structure 6 is applied.

Moreover, although the maximum dimension $m_1$ of the first sub-pixel 61 in the first direction A and the maximum dimension $m_2$ of the first sub-pixel 61 in the second direction B are inversely changed relative to the set sub-pixel 61', the area of the first sub-pixel 61 is still equal to the area of the set sub-pixel 61'. In this way, an aperture ratio of the pixel structure 6 may be ensured to be unchanged, thereby avoiding adverse effects on the display effect and the display quality of the display substrate and the display device to which the pixel structure 6 is applied.

It will be noted that, for the first sub-pixel 61, since dimensions of evaporation shadows generated on both sides of the first sub-pixel 61 are equal or approximately equal in the first direction A, and dimensions of evaporation shadows generated on both sides of the first sub-pixel 61 are equal or approximately equal in the second direction B, for convenience of description, the evaporation shadow $s_1$ in the first direction A and the evaporation shadow $s_2$ in the second direction B in the present disclosure both refer to an evaporation shadow generated on one side of the first sub-pixel 61.

In addition, each first sub-pixel 61 in the embodiments of the present disclosure refers to a portion of a film formed by the evaporation material and located in an opening of the pixel defining layer, and a region determined by the first sub-pixel is a region that actually emits light. In other regions except the region determined by the first sub-pixel, such as a spacing region between regions determined by the adjacent first sub-pixels, even if the evaporation material overlaps, light emission of the corresponding adjacent first sub-pixels 61 will not be affected.

Figure 8:
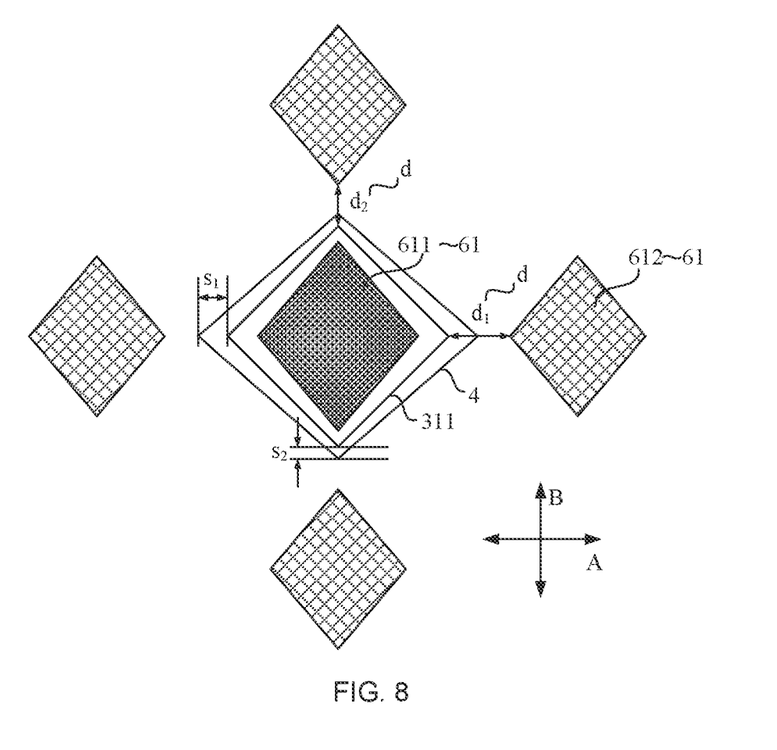
FIG. 8 is a schematic diagram when a pixel structure is evaporated, in accordance with some embodiments of the present disclosure.

In some embodiments, as shown in FIG. 8, a distance d between an orthographic projection 311 of each via hole 31 of the mask 3 on a plane on which the pixel structure 6 is located and an adjacent first sub-pixel 61 of a first sub-pixel 61 corresponding to the via hole 31 is referred to as a reserved amount d between the via hole 31 of the mask and the first sub-pixel 61.

In some examples, according to the maximum dimension of the evaporation shadow generated when the first sub-pixel 61 is evaporated (for example, a dimension of the evaporation shadow $s_1$ in the first direction), the reserved amounts d between the via hole 31 of the mask 3 and the first sub-pixel 61 may be set as: a reserved amount $d_1$ thereof in the first direction is equal to a reserve amount $d_2$ thereof in the second direction, and both of which are greater than the maximum dimension of the evaporation shadow. Since the evaporation shadow $s_1$ in the first direction A is greater than the evaporation shadow $s_2$ in the second direction, in a case where there is an error (e.g., a misalignment), in the first direction A, the evaporation material corresponding to the first sub-pixel 61 of a certain color has a higher probability of entering a region determined by an adjacent first sub-pixel 61 of other colors.

As shown in FIG. 8, by arranging the pixel structure 6 in the embodiment of the present disclosure as the above manners, the reserved amount $d_1$ between the via hole 31 of the mask 3 and the first sub-pixel 61 in the first direction A may be increased. In this way, even if the evaporation shadow $s_1$ in the first direction A is great or there is an error (e.g., the misalignment), it may also effectively prevent the evaporation material corresponding to the first sub-pixel 61 of the certain color from entering the region determined by the adjacent first sub-pixel 61 of other colors in the first direction A, thereby effectively avoiding the color mixing phenomenon in the adjacent first sub-pixel 61.

In some embodiments, the dimension of the evaporation shadow $s_1$ in the first direction A is x, and a dimension of the evaporation shadow $s_2$ in the second direction B is y, wherein x is greater than y. A difference between the maximum dimension of the first sub-pixel 61 in the second direction B and the second set value is a, wherein a is less than or equal to a product of 2 and a difference between x and y.

It will be noted that, when the first sub-pixel 61 is evaporated, after the evaporation source is selected, and a relative position of the evaporation source, the mask and the object to be evaporated is determined, the values of the evaporation shadow $s_1$ in the first direction and the evaporation shadow $s_2$ in the second direction are determined values. Each of the value x of the evaporation shadow $s_1$ in the first direction and the value y of the evaporation shadow $s_2$ in the second direction may be an average value of data obtained through multiple measurements. In this way, it is possible to minimize a measurement error and eliminate an effect of accuracy, thereby improving accuracy of the value x of the evaporation shadow $s_1$ in the first direction and the value y of the evaporation shadow $s_2$ in the second direction.

In some examples, the dimension of the first sub-pixel 61 in the first direction A and the dimension of the first sub-pixel 61 in the second direction B may be determined, according to the dimension of the evaporation shadow $s_1$ in the first direction A, the dimension of the evaporation shadow $s_2$ in the second direction B, the difference between the maximum dimension of the first sub-pixel 61 in the second direction B and the second set value, and the area of the first sub-pixel 61.

A method for determining the dimension of the first sub-pixel 61 in the first direction A and the dimension of the first sub-pixel 61 in the second direction B may be: for example, increasing a on a basis of the maximum dimension m2' of the set sub-pixel 61' in the second direction B to obtain the maximum dimension m2 of the first sub-pixel 61 in the second direction B; and calculating the maximum dimension m1 of the first sub-pixel 61 in the first direction A according to an equal relation between the area of the first sub-pixel 61 and the area of the set sub-pixel 61'. In this way, the dimension of the first sub-pixel 61 is determined according to the dimension of the evaporation shadow s1 in the first direction A and the dimension of the evaporation shadow s2 in the second direction B, so as to make the calculated maximum dimension m1 of the first sub-pixel 61 in the first direction A and the maximum dimension m2 of the first sub-pixel 61 in the second direction B more accurate, thereby avoiding the effect of evaporation shadow more effectively.

In some embodiments, as shown in FIG. 8, in two adjacent first sub-pixels 61, an evaporation shadow of one first sub-pixel 61 does not overlap with another first sub-pixel 61. In this way, it may effectively avoid the color mixing phenomenon in the adjacent sub-pixels.

Figure 9:
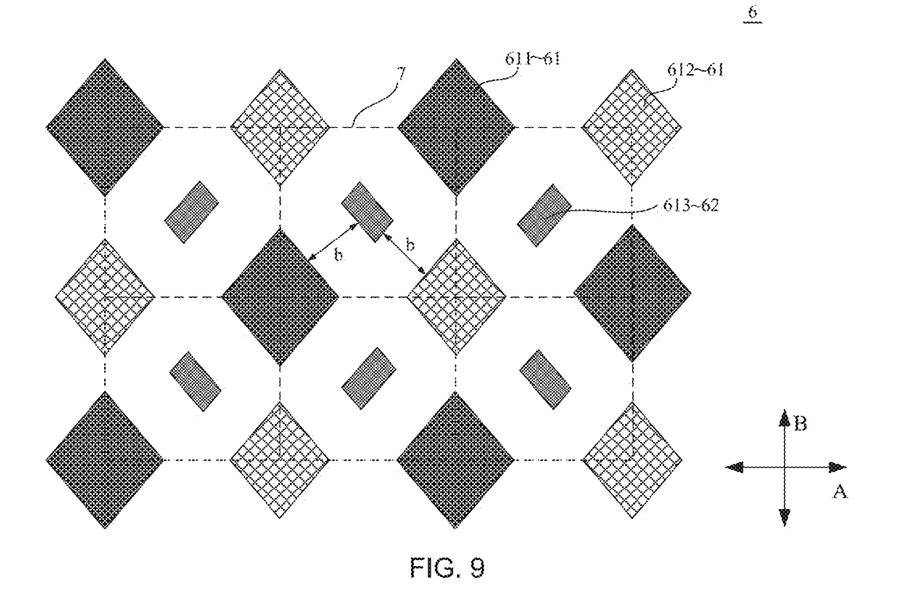
FIG. 9 is a diagram showing a structure of another pixel structure, in accordance with some embodiments of the present disclosure.

In some embodiments, the pixel structure 6 is arranged in an active area of a display substrate 100. As shown in FIG. 9, the active area includes a plurality of quadrilateral sub-regions 7, and each first sub-pixel 61 is provided at a vertex of each quadrilateral sub-region 7.

In some examples, the vertex of each quadrilateral sub-region 7 may be located at a center of a corresponding first sub-pixel 61.

In some examples, as shown in FIG. 9, a shape of the quadrilateral sub-region 7 may be a rectangle. The rectangle may be a rectangle or a square.

In some examples, as shown in FIG. 7, the first set value of the set sub-pixel 61' is equal to the second set value thereof. That is, a shape of the set sub-pixel 61' may be a square.

On this basis, as shown in FIG. 9, since the maximum dimension of the first sub-pixel 61 in the first direction A is less than the first set value, and the maximum dimension of the first sub-pixel 61 in the second direction B is greater than the second set value, a shape of the first sub-pixel 61 may be a rhombus. One diagonal line of the first sub-pixel 61 is parallel or substantially parallel to the first direction A, and another diagonal line thereof is parallel or substantially parallel to the second direction B. A length of the diagonal line parallel or substantially parallel to the second direction B is greater than a length of the diagonal line parallel to the first direction A.

By setting the first set value and the second set value of the set sub-pixel 61', the shape of the set sub-pixel 61' may be determined, and the shape of the first sub-pixel 61 may further be determined. In this way, it is beneficial to simply and accurately calculate the area of the first sub-pixel 61, and it is easy to determine the maximum dimension $m_1$ of the first sub-pixel 61 in the first direction A and the maximum dimension $m_2$ of the first sub-pixel 61 in the second direction B.

Here, for the display substrate 100, reference may be made to the description of the display substrate 100 in some embodiments below.

A calculation of the size of the first sub-pixel 61 in some embodiments of the present disclosure is schematically described below by taking an example in which the shape of the first sub-pixel 61 is a rhombus.

Supposing that the evaporation shadow $s_1$ in the first direction A is 5 μm, the evaporation shadow $s_2$ in the second direction B is 2 μm, and the first set value and the second set value of the set sub-pixel 61' are equal and are both 20 μm, the area of the set sub-pixel 61' is 200 μm². According to a difference (3 μm) between the evaporation shadow $s_1$ in the first direction A and the evaporation shadow $s_2$ in the second direction B, the difference value a between the maximum dimension $m_2$ of the first sub-pixel 61 in the second direction B and the second set value may be obtained, wherein a is less than or equal to 6 μm. Supposing that a is equal to 4 μm, the maximum dimension $m_2$ of the first sub-pixel 61 in the second direction is 24 μm. Since the area of the first sub-pixel 61 is equal to the area of the set sub-pixel 61', in this case, it may be obtained that the maximum dimension $m_1$ of the first sub-pixel 61 in the first direction A is 16.67 μm. In this way, the size of the first sub-pixel 61 is also obtained.

In some embodiments, as shown in FIG. 9, the pixel structure 6 further includes a plurality of second sub-pixels 62, and a second sub-pixel 62 is provided at a center of each quadrilateral sub-region 7.

In some examples, as shown in FIG. 9, the center of each quadrilateral sub-region 7 may be located at a center of a corresponding second sub-pixel 62.

In some embodiments, as shown in FIG. 9, the plurality of first sub-pixels 61 included in the pixel structure 6 include a plurality of red sub-pixels 611 and a plurality of blue sub-pixels 612. The plurality of second sub-pixels 62 includes a plurality of green sub-pixels 613.

In some examples, as shown in FIG. 9, the red sub-pixels 611 and the blue sub-pixels 612 are alternately arranged in the first direction A. The red sub-pixels 611 and the blue sub-pixels 612 are alternately arranged in the second direction B. In the first direction A, each column of first sub-pixels 61 and each column of second sub-pixels 62 are alternately arranged. In the second direction B, each row of first sub-pixels 61 and each row of second sub-pixels 62 are alternately arranged.

In the above example, by setting the plurality of red sub-pixels 611 and the plurality of blue sub-pixels 612 that are included in the plurality of first sub-pixels 61 to be alternately arranged both in the first direction A and in the second direction B, the plurality of first sub-pixels 61 may be more reasonably distributed, thereby improving the display effect of the display substrate or the display device to which the pixel structure 6 is applied. Moreover, by setting maximum dimensions $m_1$ of the red sub-pixel 611 and the blue sub-pixel 612 in the first direction A to be both less than the first set value, a probability of the color mixing of the red sub-pixel 611 and the blue sub-pixel 612 may be reduced, thereby improving the display quality of the display substrate or the display device to which the pixel structure 6 is applied.

In some examples, as shown in FIG. 9, in the first sub-pixels 61 and the second sub-pixel 62 that are respectively disposed at the vertexes and the center of each quadrilateral sub-region 7, a distance b between each first sub-pixel 61 and the second sub-pixel 62 is equal.

Here, the distance b between the first sub-pixel 61 and the second sub-pixel 62 may be a vertical distance (i.e., the smallest distance) between adjacent borders of the first sub-pixel 61 and the second sub-pixel 62. As shown in FIG. 9, by setting the distance b between the first sub-pixel 61 and the second sub-pixel 62 disposed at the vertex and the center of each quadrilateral sub-region 7, the shape and the size of the second sub-pixel 62 may be determined according to the distance b between each first sub-pixel 61 and the second sub-pixel 62 after that the shape and the size of each first sub-pixel 61 are determined.

In some examples, an evaporation shadow of each first sub-pixel 61 does not overlap with the adjacent second sub-pixel 62. In this way, it may avoid the color mixing phenomenon between the first sub-pixel 61 and the adjacent second sub-pixel 62, so as to ensure good display quality and display effect of the display substrate or the display device to which the pixel structure 6 is applied.

Figure 10:
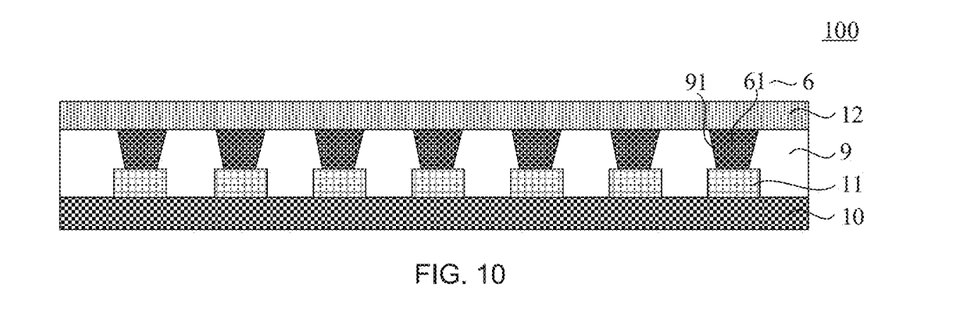
FIG. 10 is a diagram showing a structure of a display substrate, in accordance with some embodiments of the present disclosure.

Some embodiments of the present disclosure further provide a display substrate 100. As shown in FIG. 10, the display substrate 100 includes a base 10 and the pixel structure 6 as provided in some of the above embodiments. The pixel structure 6 is disposed on a side of the base 10.

Types of the base 10 may be various, which may be selected and set according to actual needs.

For example, the base 10 may be a rigid base. The rigid base may be, for example, a glass base.

For another example, the base 10 may be a flexible base. The flexible base, for example, may be a polyethylene terephthalate (PET) base, a polyethylene naphthalate two formic acid glycol ester (PEN) base, a polymethyl methacrylate (PMMA) base, or a polyimide (PI) base.

Since the display substrate 100 provided by some embodiments of the present disclosure includes the pixel structure 6, the maximum dimensions $m_1$ of the plurality of first sub-pixels 61 included in the pixel structure 6 in the first direction A are all less than the first set value, and the maximum dimensions $m_2$ of the plurality of first sub-pixels 61 included in the pixel structure 6 in the second direction B are all greater than the second set value, the probability of color mixing in the pixel structure 6 obtained through evaporation may be reduced, thereby improving the display effect and the display quality of the display substrate 100 effectively.

Figure 11:
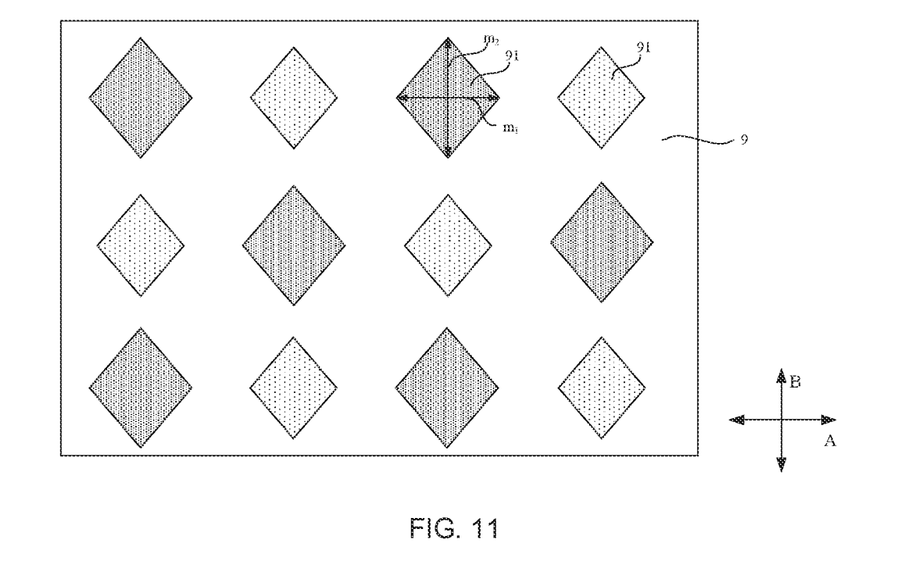
FIG. 11 is a top view of a pixel defining layer in a display substrate, in accordance with some embodiments of the present disclosure.

In some embodiments, as shown in FIG. 10 and FIG. 11, the display substrate further includes a pixel defining layer 9 disposed on a side of the base 10. The pixel defining layer 9 has a plurality of first openings 91. The plurality of first sub-pixels 61 included in the pixel structure 6 are respectively disposed in the plurality of first openings 91.

In some examples, the first opening 91 and the first sub-pixel 61 are in one-to-one correspondence. That is, each first opening 91 is provided with a first sub-pixel 61 therein.

It will be noted that, shapes, sizes and arrangement manners of the plurality of first openings 91 may be set with reference to the pixel structure 6 provided in some embodiments of the present disclosure, which will not be repeated here.

A position, shape and size of each first opening 91 can define a position, shape and size of the corresponding first sub-pixel 61. Therefore, the position, shape, and size of each first sub-pixel 61 are the same as the position, shape and size of the corresponding first opening 91. That is, the maximum dimension of the first opening 91 in the first direction A is equal to the maximum dimension $m_1$ of the first sub-pixel 61 in the first direction A. Similarly, the maximum dimension of the first opening 91 in the second direction B is equal to the maximum dimension $m_2$ of the first sub-pixel 61 in the second direction B. Moreover, the maximum dimension of the first opening 91 in the first direction A is less than the first set value, and the maximum dimension of the first opening 91 in the second direction B is greater than the second set value.

Figure 12:
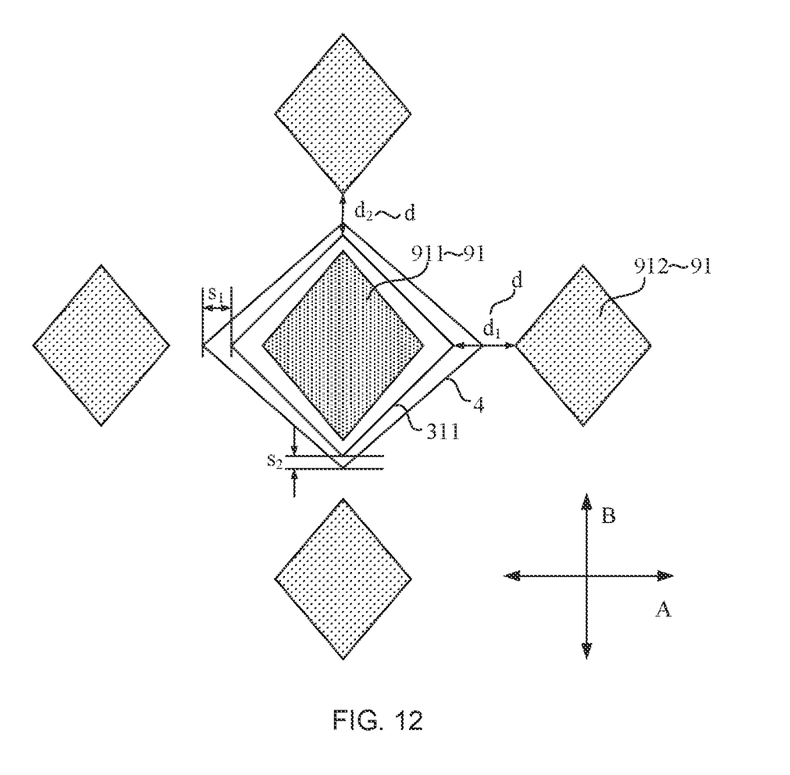
FIG. 12 is a schematic diagram of a first opening in a display substrate during being evaporated, in accordance with some embodiments of the present disclosure.

In some examples, as shown in FIG. 12, the reserved amount d (the distance between the orthographic projection 311 of each via hole 31 of the mask 3 on the plane on which the pixel structure 6 is located and the adjacent first sub-pixel 61 of the first sub-pixel 61 corresponding to the via hole 31) between the via hole 31 of the mask and the first sub-pixel 61 is a distance between an orthographic projection 311 of each via hole 31 of the mask 3 on the pixel defining layer 9 and an adjacent first opening 91 of a first opening 91 corresponding to the via hole 31. The distance may be referred to as the reserved amount d between the via hole 31 of the mask and the first opening 91.

Since the maximum dimension $m_1$ of the first opening 91 in the first direction A is less than the first set value, and the maximum dimension $m_2$ of the first opening 91 in the second direction B is greater than the second set value, the reserved amount $d_1$ between the via hole 31 of the mask and the first opening 91 in the first direction may be increased, so as to prevent the evaporation material in the evaporation shadow $s_1$ in the first direction A from entering the adjacent first opening 91, and prevent evaporation materials of different colors from being overlapped in a same first opening 91. Therefore, the probability of the color mixing phenomenon may be reduced on a premise of ensuring the aperture ratio of the display substrate 100, thereby improving the display effect and the display quality of the display substrate 100.

In some embodiments, as shown in FIG. 10, the display substrate further includes a plurality of anodes 11 disposed on a side of the plurality of first sub-pixels 61 proximate to the base 10. The plurality of anodes 11 may be disposed in the plurality of first openings 91 of the pixel defining layer 9, respectively. Or, the plurality of anodes 11 may also be disposed on a side of the pixel defining layer 9 proximate to the base 10.

In some examples, as shown in FIG. 10, the display substrate further includes a plurality of cathodes 12 disposed on a side of the plurality of first sub-pixels 61 away from the base 10. The plurality of cathodes 12 may be disposed in the plurality of first openings 91 of the pixel defining layer 9, respectively. Or, the plurality of cathodes 12 may be an integrated structure and are disposed on a side of the pixel defining layer 9 away from the base 10. Each first sub-pixel 61 may emit light under driving of voltages transmitted by a corresponding anode 11 and a corresponding cathode 12.

Figure 13:
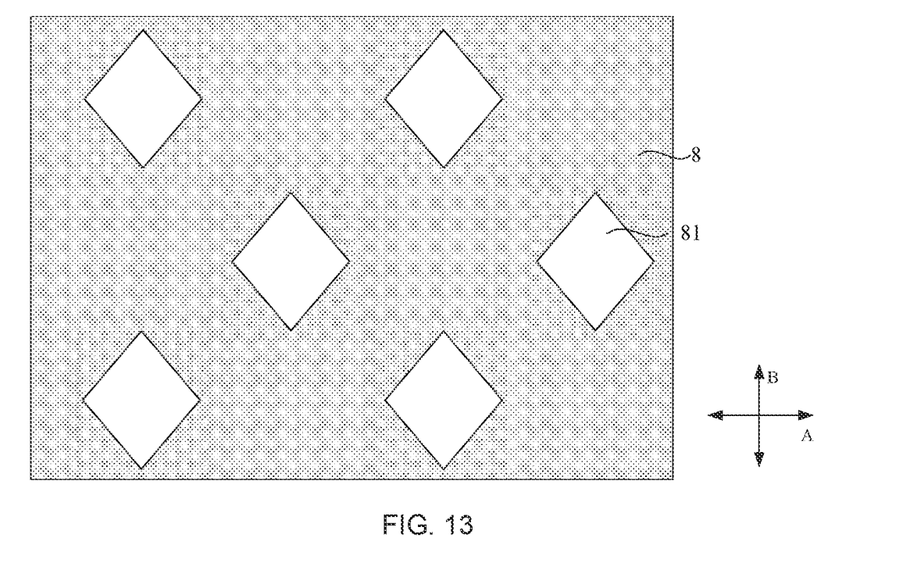
FIG. 13 is a diagram showing a structure of a mask, in accordance with some embodiments of the present disclosure.
Figure 14:
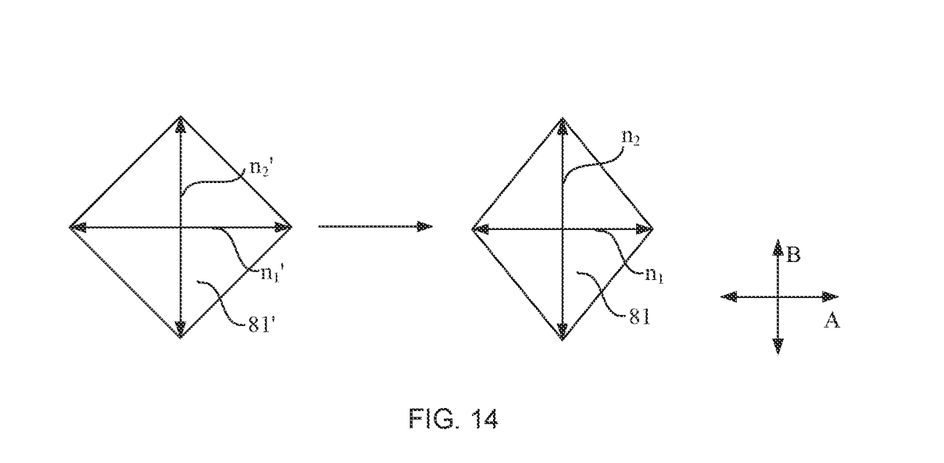
FIG. 14 is a comparison diagram of a second opening in a mask and a set opening, in accordance with some embodiments of the present disclosure.

Some embodiments of the present disclosure further provide a mask 8 for forming the pixel structure 6 as described in some of the above embodiments. As shown in FIGS. 13 and 14, the mask 8 includes a plurality of second openings 81. The maximum dimension n of a second opening 81 in the first direction A is less than a third set value, and the third set value is a maximum dimension $n_1'$ of a set opening 81' in the first direction A.

In some examples, the set opening 81' is an original via hole after comprehensively considering four factors including a position accuracy, a size accuracy, and an alignment accuracy of a set sub-pixel 61' to be evaporated (that is, the sub-pixel 5), an alignment accuracy and a temperature effect of an evaporation chamber, a position accuracy and a size accuracy of the via hole 31 of the mask, and the evaporation shadow. A via hole 31 of a mask corresponding to the set sub-pixel 61' is the set opening 81', that is, the via hole 31 of the mask 3 mentioned in the related art. A reserved amount $d_1'$ between the set opening 81' and the set sub-pixel 61' in the first direction A is equal to a reserved amount $d2'$ between the set opening 81' and the set sub-pixel 61' in the second direction B. The set opening 81' provides a reference for a size design of the second opening 81, and each set sub-pixel 61' has a corresponding set opening 81'.

In the mask 8 provided by some embodiments of the present disclosure, the maximum dimension $n_1$ of the second opening 81 in the first direction A is less than the third set value. That is, the maximum dimension $n_1'$ of the set opening 81' in the first direction is reduced to obtain the second opening 81.

It will be noted that, the embodiments of the present disclosure do not limit the maximum dimension $n_2$ of the second opening 81 in the second direction B, as long as it can meet a size requirement when the first sub-pixel 61 is evaporated.

For example, the maximum dimension $n_2$ of the second opening 81 in the second direction B is equal to the maximum dimension $n_2'$ of the set opening 81' in the second direction B.

For example, since the dimension of the evaporation shadow $s_1$ in the first direction A is x, the dimension of the evaporation shadow $s_2$ in the second direction B is y, and x is greater than y, the reserved amounts between the via hole 31 of the mask and the first sub-pixel 61 in different directions may be set according to the different values of the evaporation shadows in the first direction A and the second direction B. For example, the dimension of the evaporation shadow $s_2$ in the second direction B is less than the dimension of the evaporation shadow $s_1$ in the first direction by a difference between x and y, and a reserved amounts d' between the set opening 81' and the setting sub-pixel 61' in the first direction A and the second direction B are equal. Therefore, the reserved amount between the set opening 81' and the set sub-pixel 61' has an excess amount of a difference between x and y in the second direction B. In this case, the reserved amount d2' between the set opening 81' and the set sub-pixel 61' in the second direction B may be reduced. That is, the maximum dimension $n_2$ of the second opening 81 in the second direction B may be increased. In this way, allocation of the reserved amounts in different directions between the second opening 81 of the mask 8 and the first sub-pixel 61 may be more reasonable.

Figure 15:
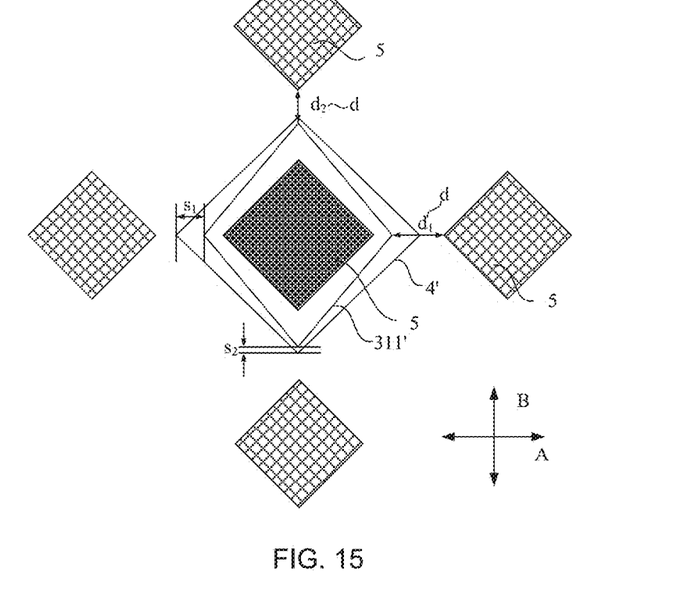
FIG. 15 is a schematic diagram of a mask during being evaporated, in accordance with some embodiments of the present disclosure.

By arranging the second opening 81 of the mask 8 as described above, when the first sub-pixels 61 are evaporated, a row direction in which the second openings 81 are arranged may be parallel to a row direction in which the first sub-pixels 61 are arranged, and a column direction in which the second openings 81 are arranged is parallel to a column direction in which the first sub-pixels 61 are arranged. As shown in FIG. 15, an evaporation region defined by the second opening 81 is 311', and a range of a formed evaporation shadow is 4'. Since the maximum dimension $n_1$ of the second opening 81 in the first direction A is less than the third set value, the value of the reserved amount $d_1$ between the second opening 81 and the sub-pixel 5 in the first direction A is increased relative to the value of the reserved amount $d_1$ between the set opening 81' and the sub-pixel 5 in the first direction A. Even if the evaporation shadow $s_1$ in the first direction A is large, the evaporation material in the evaporation shadow may be prevented from entering a region defined by adjacent sub-pixels 5 of other colors. In this way, it is possible to avoid an overlapping phenomenon of organic materials of different colors in the region defined by the adjacent sub-pixels 5, reduce the probability of the color mixing phenomenon of the adjacent sub-pixels 5, and improve the display effect and the display quality of the display substrate to which the manufactured pixel structure is applied.

It will be noted that, in some examples of the present disclosure, an arrangement manner of the pixel structure 6 and an arrangement manner of the mask 8 are used in combination, which can further effectively avoid the color mixing phenomenon in the adjacent first sub-pixels 61.

Here, the maximum dimension $m_1$ of the first sub-pixel 61 in the first direction A, the maximum dimension $m_2$ in the second direction B, the maximum dimension $n_1$ of the second opening 81 in the first direction A, and the maximum dimension $n_2$ of the second opening 81 in the second direction B may be set according to actual needs, as long as the value of the reserved amount between the second opening 81 and the first sub-pixel 61 in the first direction A is increased relative to the value of the reserved amount between the set opening 81' and the set sub-pixel 61' in the first direction A.

Figure 16:
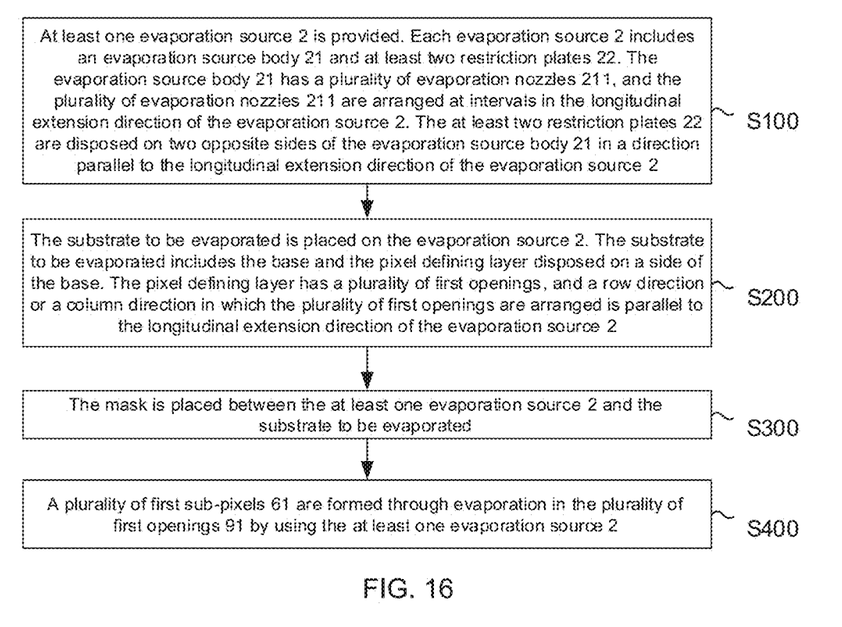
FIG. 16 is a flow diagram of an evaporation method, in accordance with some embodiments of the present disclosure.

Some embodiments of the present disclosure further provide an evaporation method for forming the display substrate as described in some of the above embodiments. As shown in FIG. 16, the evaporation method includes S100 to S400.

In S100, as shown in FIGS. 1 and 2, at least one evaporation source 2 is provided. Each evaporation source 2 includes an evaporation source body 21 and at least two restriction plates 22. The evaporation source body 21 has a plurality of evaporation nozzles 211, and the plurality of evaporation nozzles 211 are arranged at intervals in the longitudinal extension direction of the evaporation source 2. The at least two restriction plates 22 are disposed on two opposite sides of the evaporation source body 21 in a direction parallel to the longitudinal extension direction of the evaporation source 2.

For example, the evaporation source 2 may be a linear evaporation source.

In S200, the substrate to be evaporated is placed on the evaporation source 2. The substrate to be evaporated includes the base and the pixel defining layer disposed on a side of the base. The pixel defining layer has a plurality of first openings, and a row direction or a column direction in which the plurality of first openings are arranged is parallel to the longitudinal extension direction of the evaporation source 2.

For example, the substrate to be evaporated may be a motherboard 1 or a display substrate to be formed.

In the S200, the base and the pixel defining layer included in the substrate to be evaporated may be, for example, the base 10 and the pixel defining layer 9 included in the display substrate 100 provided in some embodiments of the present disclosure. Correspondingly, the first openings in the pixel defining layer included in the substrate to be evaporated are a plurality of first openings 91 of the pixel defining layer 9. The maximum dimension $m_1$ of the first opening 91 in the first direction A is less than the first set value, and the maximum dimension $m_2$ of the first opening 91 in the second direction B is greater than the second set value.

In S300, the mask is placed between the at least one evaporation source 2 and the substrate to be evaporated.

Here, the mask forms a support for the substrate to be evaporated.

In S400, a plurality of first sub-pixels 61 are formed through evaporation in the plurality of first openings 91 by using the at least one evaporation source 2.

In the above embodiments, when the first sub-pixel 61 is evaporated, positions of the substrate to be evaporated and the evaporation source 2 may be set as required. For example, the row direction in which the plurality of first openings 91 of the pixel defining layer 9 are arranged is parallel to the longitudinal extension direction of the evaporation source 2.

In this way, the evaporation shadow $s_1$ in the first direction A will be greater than the evaporation shadow $s_2$ in the second direction. Since the maximum dimension $m_1$ of the first opening 91 in the first direction A is less than the first set value, and the maximum dimension $m_2$ of the first opening 91 in the second direction B is greater than the second set value, it may reduce the probability of the evaporation material in the evaporation shadow $s_1$ in the first direction A entering the first opening 91 in which the adjacent first sub-pixel 61 is located, so that a possibility that evaporation materials of different colors overlap in a same first opening 91 may be reduced, thereby avoiding the color mixing phenomenon in the adjacent first sub-pixels 61 and improving the display effect of the manufactured display substrate.

In some embodiments, the mask used in the evaporation method provided in the present disclosure is the mask 8 provided by some of the above embodiments. The row direction in which the plurality of second openings 81 of the mask 8 are arranged may be parallel to the longitudinal extension direction of the evaporation source 2.

During the evaporation process, the evaporation source 2 may be moved in a direction perpendicular to the longitudinal extension direction of the evaporation source 2, so as to deposit the evaporation material in the plurality of first openings 91 of the pixel defining layer 9.

In some of the above embodiments, while setting the dimensions of the plurality of first openings 91 of the pixel defining layer 9 in the first direction A and in the second direction B, the dimensions of the plurality of second openings 81 of the mask 8 in the first direction A are set. During the evaporation process, the probability of the evaporation material entering the adjacent first opening 91 may be further reduced, so that the possibility that the evaporation materials of different colors overlap in the first opening 91 may be further reduced. In this way, the color mixing phenomenon of the adjacent first sub-pixels 61 may be reduced, and the display effect and the display quality of the manufactured display substrate may be improved.

The forgoing descriptions are merely specific implementations of the present disclosure, but the protection scope of the present disclosure is not limited thereto. Any changes or replacements those skilled in the art could conceive of within the technical scope of the present disclosure shall be included in the protection scope of the present disclosure. Therefore, the protection scope of the present disclosure shall be subject to the protection scope of the claims.

What is claimed is:

1. A pixel structure, comprising:
    a plurality of first sub-pixels arranged in a first direction and in a second direction, a maximum dimension of at least one first sub-pixel in the first direction being less than a first set value, and a maximum dimension of the at least one first sub-pixel in the second direction being greater than a second set value;
    an evaporation shadow disposed around the first sub-pixel;
    wherein a shape of a set sub-pixel is a rhombus;
    the first set value is a maximum dimension of the set sub-pixel in the first direction, and the maximum dimension of the set sub-pixel in the first direction is a length of a diagonal line of the set sub-pixel in the first direction:
    the second set value is a maximum dimension of the set sub-pixel in the second direction, and the maximum dimension of the set sub-pixel in the second direction is a length of a diagonal line of the set sub-pixel in the second direction;
    the first sub-pixel has an area equal to an area of the set sub-pixel;
    a dimension of an evaporation shadow in the first direction is x, and a dimension of the evaporation shadow in the second direction is y, wherein x is greater than y; and
    a difference between the maximum dimension of the first sub-pixel in the second direction and the second set value is a, wherein a is less than or equal to a product of 2 and a difference between x and y.

2. The pixel structure according to claim 1, wherein in two adjacent first sub-pixels, an evaporation shadow of one first sub-pixel is non-overlapping with another first sub-pixel.

3. The pixel structure according to claim 1, wherein the plurality of first sub-pixels are arranged at vertexes of a plurality of quadrilateral sub-regions, and a first sub-pixel is disposed at each vertex.

4. The pixel structure according to claim 3, wherein a shape of the quadrilateral sub-region is a rectangle.

5. The pixel structure according to claim 3, wherein a shape of the first sub-pixel is a rhombus; and
    one diagonal line of the first sub-pixel is parallel to the first direction, and another diagonal line of the first sub-pixel is parallel to the second direction; a length of the diagonal line parallel to the second direction is greater than a length of the diagonal line parallel to the first direction.

6. The pixel structure according to claim 5, wherein the first set value is equal to the second set value.

7. The pixel structure according to claim 3, further comprising a plurality of second sub-pixels, wherein
    a second sub-pixel is disposed at a center of each quadrilateral sub-region.

8. The pixel structure according to claim 7, wherein the plurality of first sub-pixels include a plurality of red sub-pixels and a plurality of blue sub-pixels; and the plurality of second sub-pixels include a plurality of green sub-pixels;
    in the first direction, the red sub-pixels and the blue sub-pixels are alternately arranged; and
    in the second direction, the red sub-pixels and the blue sub-pixels are alternately arranged.

9. The pixel structure according to claim 7, wherein in first sub-pixels and a second sub-pixel that are respectively disposed at vertexes and a center of each quadrilateral sub-region, a distance between each first sub-pixel and the second sub-pixel is equal.

10. The pixel structure according to claim 7, wherein an evaporation shadow of each first sub-pixel is non-overlapping with an adjacent second sub-pixel.

11. A display substrate, comprising:
    a base; and
    the pixel structure according to claim 1, the pixel structure being disposed on a side of the base.

12. The display substrate according to claim 11, further comprising a pixel defining layer disposed on the side of the base, the pixel defining layer having a plurality of first openings;
    wherein the plurality of first sub-pixels included in the pixel structure are respectively disposed in the plurality of first openings; and a size of each first opening and a size of a first sub-pixel disposed in the first opening are same.

13. The display substrate according to claim 12, wherein the plurality of first sub-pixels are arranged in an active area of the display substrate, the active area includes a plurality of quadrilateral sub-regions, and a first sub-pixel is disposed at a vertex of each quadrilateral sub-region.

14. The display substrate according to claim 13, wherein a shape of the first sub-pixel is a rhombus; and
    one diagonal line of the first sub-pixel is parallel to the first direction, and another diagonal line of the first sub-pixel is parallel to the second direction; a length of the diagonal line parallel to the second direction is greater than a length of the diagonal line parallel to the first direction.

15. The display substrate according to claim 14, wherein the first set value is equal to the second set value.

16. The display substrate according to claim 13, further comprising a plurality of second sub-pixels, wherein a second sub-pixel is disposed at a center of each quadrilateral sub-region.

17. A mask for forming the pixel structure according to claim 1, the mask comprising a plurality of second openings;
   a maximum dimension of a second opening in the first direction being less than a third set value;
   wherein the third set value is a maximum dimension of a set opening for the set sub-pixel in the first direction.

18. An evaporation method for forming the display substrate according to claim 11; the evaporation method comprising:
   providing at least one evaporation source, each evaporation source including an evaporation source body and at least two restriction plates, the evaporation source body having a plurality of evaporation nozzles arranged at intervals in a longitudinal extension direction of the evaporation source, and the at least two restriction plates being disposed on two opposite sides of the evaporation source body in a direction parallel to the longitudinal extension direction of the evaporation source;
   placing a substrate to be evaporated on the at least one evaporation source, the substrate to be evaporated including a base and a pixel defining layer disposed on a side of the base, the pixel defining layer having a plurality of first openings, and a row direction or a column direction in which the plurality of first openings are arranged being parallel to the longitudinal extension direction of the evaporation source;
   placing a mask between the at least one evaporation source and the substrate to be evaporated, wherein the mask includes a plurality of second openings, a maximum dimension of a second opening in the first direction is less than a third set value, and the third set value is a maximum dimension of a set opening for the set sub-pixel in the first direction; and
   forming a plurality of first sub-pixels in the plurality of first openings by using the at least one evaporation source.

* * * * *